(12) United States Patent
Härle et al.

(10) Patent No.: US 9,431,580 B2
(45) Date of Patent: Aug. 30, 2016

(54) METHOD FOR PRODUCING AN OPTOELECTRONIC COMPONENT, AND AN OPTOELECTRONIC COMPONENT

(75) Inventors: Volker Härle, Laaber (DE); Christine Höss, Regensburg (DE); Alfred Lell, Maxhütte-Haidhof (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 164 days.

(21) Appl. No.: 11/904,203

(22) Filed: Sep. 26, 2007

(65) Prior Publication Data
US 2008/0121923 A1 May 29, 2008

(30) Foreign Application Priority Data

Sep. 26, 2006 (DE) .......... 10 2006 045 439
Nov. 16, 2006 (DE) .......... 10 2006 054 069

(51) Int. Cl.
*H01L 33/00* (2010.01)
*H01L 33/44* (2010.01)
*H01S 5/028* (2006.01)

(52) U.S. Cl.
CPC .......... *H01L 33/44* (2013.01); *H01S 5/0282* (2013.01); *H01L 2933/0025* (2013.01); *H01L 2933/0041* (2013.01); *H01S 5/0287* (2013.01); *H01S 2301/176* (2013.01)

(58) Field of Classification Search
CPC .......... H01L 33/44; H01L 2933/0025; H01L 2933/0041
USPC .......... 257/81, 82, 91, 98, 99, 100, 116, 257/432–437, 749, E33.059; 438/25–35
See application file for complete search history.

(56) References Cited

U.S. PATENT DOCUMENTS

| 4,317,086 | A | * | 2/1982 | Scifres et al. ........... 257/98 |
| 4,337,443 | A | * | 6/1982 | Umeda et al. ........... 372/49.01 |
| 5,078,847 | A | * | 1/1992 | Grosman ........... C23C 14/32 |
| | | | | 204/298.05 |
| 5,140,457 | A | | 8/1992 | Letter |
| 5,665,637 | A | * | 9/1997 | Chand ........... 372/43.01 |
| 5,802,091 | A | * | 9/1998 | Chakrabarti ........... H01S 5/0282 |
| | | | | 372/49.01 |
| 6,441,963 | B2 | * | 8/2002 | Murakami ........... B82Y 10/00 |
| | | | | 359/580 |

(Continued)

FOREIGN PATENT DOCUMENTS

EP 0 814 544 6/1997
EP 0 845 839 11/1997

(Continued)

OTHER PUBLICATIONS

S Swann, "Magnetron Sputtering", Physics in Technology, 19, pp. 67-75, 1988.*

(Continued)

*Primary Examiner* — Ha Tran T Nguyen
*Assistant Examiner* — Jordan Klein
(74) *Attorney, Agent, or Firm* — Cozen O'Connor

(57) ABSTRACT

A method for producing an optoelectronic component comprising the steps of providing a semiconductor layer sequence having at least one active region, wherein the active region is suitable for emitting electromagnetic radiation during operation, and applying at least one layer on a first surface of the semiconductor layer sequence by means of an ion assisted application method.

10 Claims, 3 Drawing Sheets

(56) References Cited

U.S. PATENT DOCUMENTS

| | | | |
|---|---|---|---|
| 6,618,409 B1* | 9/2003 | Hu et al. | 372/43.01 |
| 6,680,799 B1* | 1/2004 | Parriaux | G02B 5/1809 257/98 |
| 6,798,811 B1* | 9/2004 | Sugahara et al. | 372/49.01 |
| 6,809,344 B2* | 10/2004 | Osaka | 257/98 |
| 7,084,436 B2* | 8/2006 | DenBaars | H01L 33/08 257/101 |
| 2003/0156614 A1* | 8/2003 | Ueda et al. | 372/49 |
| 2004/0238828 A1 | 12/2004 | Ito | |
| 2005/0040418 A1* | 2/2005 | Osaka | 257/98 |
| 2005/0145968 A1* | 7/2005 | Goela et al. | 257/437 |
| 2005/0215008 A1* | 9/2005 | Orlowski et al. | 438/257 |
| 2006/0017011 A1* | 1/2006 | Shang | 250/492.1 |
| 2006/0049411 A1* | 3/2006 | Nakamura | H01L 33/0079 257/79 |
| 2006/0073692 A1 | 4/2006 | Yoshida et al. | |
| 2007/0025231 A1* | 2/2007 | Ochiai | B82Y 20/00 369/122 |

FOREIGN PATENT DOCUMENTS

| | | |
|---|---|---|
| EP | 0 898 345 | 2/1999 |
| EP | 1 067 642 | 7/2000 |
| EP | 1 164 669 | 11/2000 |
| EP | 1 650 841 | 7/2004 |
| EP | 1 748 524 | 7/2006 |
| JP | 07-066500 | 3/1995 |
| JP | 07-079049 | 3/1995 |
| JP | 09-027639 | 1/1997 |
| JP | 2000-332342 | 11/2000 |
| JP | 2004-093914 | 3/2004 |
| JP | 2004-281686 | 10/2004 |
| JP | 2006-066645 | 3/2006 |

OTHER PUBLICATIONS

K. Bange et al., "Investigations of $TiO_2$ Films Deposited by Different Techniques", Thin Solid Films, 197, pp. 279-285, 1991.

M. Okayasu et al., "Facet Oxidation of InGaAs/GaAs strained quantum-well lasers", Journal of Applied Physics, vol. 69, No. 12, pp. 8346-8351, Jun. 15, 1991.

S. Ito et al., "AlGaInN violet laser diodes grown on GaN substrates with low aspect ratio", Phys. Stat. Sol. (a) 200, No. 1, pp. 131-134, 2003.

I. Schnitzer et al., "30% external quantum efficiency from surface textured, thin-film light-emitting diodes", Appl. Phys. Lett., vol. 63, No. 16, pp. 2174-2176, Oct. 18, 1993.

T.C. Kimble et al., "Optical waveguide characterization of dielectric films deposited by reactive low-voltage ion plating", Applied Optics, vol. 32, No. 28, pp. 5640-5644, Oct. 1, 1993.

T.M. Smeeton et al., "Atomic force microscopy analysis of cleaved facets in III-nitride laser diodes grown on free-standing GaN substrates", Applied Physics Letters, vol. 88, pp. 1-3 , 2006.

T. Mukai et al., "Current status and future prospects of GaN-based LED's and LD's", Phys. Stat. Sol. (a) 201, No. 12, pp. 2712-2716, 2004.

T. Schoedl et al., "Facet degradation of (Al,In) GaN laser diodes", Phys. Stat. Sol. (a) 201, No. 12, pp. 2635-2638, 2004.

V. Kümmler et al., "Gradual facet degradation of (Al, In) GaN quantum well lasers", Applied Physics Letters, vol. 84, No. 16, pp. 2989-2991, Apr. 19, 2004.

* cited by examiner

US 9,431,580 B2

METHOD FOR PRODUCING AN OPTOELECTRONIC COMPONENT, AND AN OPTOELECTRONIC COMPONENT

RELATED APPLICATIONS

This patent application claims the priority of German patent application nos. 10 2006 045 439.1 filed Sep. 26, 2006 and 10 2006 054 069.7 filed Nov. 16, 2006, the disclosure content of both of which is hereby incorporated by reference.

FIELD OF THE INVENTION

The present invention relates to an optoelectronic component and to a method for producing the optoelectronic component.

BACKGROUND OF THE INVENTION

Optoelectronic semiconductor chips such as light emitting diodes (LEDs), laser diodes or photodiodes are increasingly becoming key components for applications, for instance in lighting technology, projection, data storage or printing technology, for example owing to their compactness and cost-effective production. In this case, the production for example of ageing-stable laser diodes or LEDs can represent a particular technological challenge.

In accordance with the document M. Okayasu, M. Fukuda, T. Takeshita, S. Uehara, K. Kurumada, "Facet oxidation of InGaAs/GaAs strained quantum-well lasers", J. Appl. Phys., Volume 69, 1991, pp. 8346-8351, light-induced oxidation of a thus to thermal heating, which can result in thermal destruction of the laser facet ("catastrophic optical damage") and thus in device failure.

Furthermore, the documents V. Kümmler, A. Lell, V. Härle, U. T. Schwarz, T. Schödl, W. Wegscheider, "Gradual facet degradation of (Al,In)GaN quantum well lasers", Applied Physics Letters, Volume 84, Number 16, 2004, pp. 2989-2991 and T. Schödl, U. T. Schwarz, S. Miller, A. Leber, M. Furitsch, A. Lell, V. Härle, "Facet degradation of (Al, In)GaN heterostructure laser diodes", Phys. stat. sol. (a), Volume 201, Number 12, 2004, pp. 2635-2638 disclose that in AlInGaN lasers having unpassivated laser facets, an intensified degradation of the devices can be observed during operation in moisture.

It is possible, for instance, to incorporate laser diodes for example into hermetically sealed housings under protective gas. However, in this case opening the housing can result in severe device ageing. Moreover, such hermetically sealed housings are for example disadvantageous for example with regard to increased additional costs in conjunction with an increased outlay on assembly and also with regard to a limited flexibility for numerous applications in respect of the design size and integration of other optical components.

SUMMARY OF THE INVENTION

It is one object of specific embodiments of the present invention to provide a method for producing an optoelectronic component which comprises an ion assisted application method. Furthermore, it is an object of specific embodiments of the present invention to provide an optoelectronic component.

These and other objects are attained in accordance with one aspect of the present invention directed to a method for producing an optoelectronic component comprising the steps of:

A) providing a semiconductor layer sequence having at least one active region, wherein the active region is suitable for emitting electromagnetic radiation during operation, and B) applying at least one layer on a first surface of the semiconductor layer sequence by means of an ion assisted application method.

In this case, the active region of the semiconductor layer sequence can generate electromagnetic radiation with a spectrum in particular in the ultraviolet to infrared wavelength range during operation. In particular, the spectrum can have for example a spectral component at one wavelength or in a wavelength range. Furthermore, the spectrum can comprise one or a plurality of spectral components having different wavelengths or wavelength ranges.

In a further embodiment, the semiconductor layer sequence is embodied as an epitaxial layer sequence or as a radiation emitting semiconductor chip having an epitaxial layer sequence, that is to say as an epitaxially grown semiconductor layer sequence. In this case, the semiconductor layer sequence can be embodied for example on the basis of an inorganic material, for instance InGaAlN, such as, for instance, GaN thin-film, semiconductor chips. InGaAlN-based semiconductor chips include in particular those in which the epitaxially produced semiconductor layer sequence, which generally has a layer sequence composed of different individual layers, contains at least one individual layer which has a material from the III-V compound semiconductor material system $In_xAl_yGa_{1-x-y}N$ where $0 \le x \le 1$, $0 \le y \le 1$ and $x+y \le 1$. Semiconductor layer sequences which have at least one active layer based on InGaAlN can emit for example preferably electromagnetic radiation having one or a plurality of spectral components in an ultraviolet to green wavelength range.

As an alternative or in addition the semiconductor layer sequence can also be based on InGaAlP, that is to say that the semiconductor layer sequence has different individual layers, at least one individual layer of which has a material from the III-V compound semiconductor material system $In_xAl_yGa_{1-x-y}P$ where $0 \le x \le 1$, $0 \le y \le 1$ and $x+y \le 1$. Semiconductor layer sequences which have at least one active layer based on InGaAlP can emit for example preferably electromagnetic radiation having one or a plurality of spectral components in a green to red wavelength range.

As an alternative or in addition, the semiconductor layer sequence can also have other II-V compound semiconductor material systems, for example an AlGaAs-based material, or II-VI compound semiconductor material systems. In particular, an active layer having an AlGaAs-based material can be suitable for emitting electromagnetic radiation having one or a plurality of spectral components in a red to infrared wavelength range.

In a further embodiment, the semiconductor layer sequence or the radiation emitting semiconductor chip is embodied as a thin-film semiconductor chip. A thin-film semiconductor chip is distinguished in particular by the following characteristic features:

a reflective layer is applied or formed at a first main surface—facing a carrier element—of a radiation-generating epitaxial layer sequence, said reflective layer reflecting at least one portion of the electromagnetic radiation generated in the epitaxial layer sequence back into the latter;

the epitaxial layer sequence has a thickness within the range of 20 μm or less, in particular in the region of 10 μm, and the epitaxial layer sequence contains at least one semiconductor layer having at least one area which has an intermixing structure which ideally leads to an approximately ergodic distribution of the light in the epitaxial layer sequence, that is to say that it has an as far as possible ergodically stochastic scattering behavior.

A basic principle of a thin-film semiconductor chip is described for example in 1. Schnitzer et al., Appl. Phys. Lett, 63 (16), Oct. 18, 1993, 2174-2176, the disclosure content of which is hereby incorporated by reference.

The semiconductor layer sequence can have as active region for example a conventional pn junction, a double heterostructure, a single quantum well structure (SQW structure) or a multiple quantum well structure (MQW structure). Additional to the active region, the semiconductor layer sequence can comprise further functional layers and functional regions, for instance p- or n-doped charge carrier transport layers, that is to say electron or hole transport layers, p- or n-doped confinement or cladding layers, a growth or carrier substrate, buffer layers, protective layers and/or electrodes and also combinations thereof. Such structures relating to the active region or the further functional layers and regions are known to the person skilled in the art in particular with regard to construction, function and structure and, therefore, are not explained in any greater detail at this point.

In an embodiment of the method, the semiconductor layer sequence has two main surfaces that are formed for example by the surfaces—in each case remote from the semiconductor layer sequence—of the layer of the semiconductor layer sequence that is arranged at the very top and the layer of the semiconductor layer sequence that is arranged at the very bottom. In particular, the main surfaces can form interfaces of the semiconductor layer sequence in a direction perpendicular to a main extension plane of the semiconductor layers, i.e. in a growth direction of the semiconductor layer sequence. Furthermore, the semiconductor layer sequence can have side surfaces which can adjoin the two main surfaces and can delimit the semiconductor layer sequence in a direction parallel to a main extension plane, that is to say laterally. In particular, the first surface can comprise or be such a side surface. In this case, it can be possible, in particular, that the first surface is adjacent to the active region. As an alternative or in addition, the first surface can also comprise or be a main surface.

In a further embodiment of the method, the semiconductor layer sequence has a radiation exit area, via which the electromagnetic radiation can be emitted which is generated in the active layer during operation. Particularly preferably, the first surface comprises a radiation exit area or is a radiation exit area. By way of example, the semiconductor layer sequence can be an edge emitting laser diode or a laterally emitting LED, such that the radiation exit area can comprise or be a side surface. Furthermore, the radiation exit area can for example also comprise two side surfaces which can preferably be formed by two mutually opposite side surfaces of the semiconductor layer sequence. Furthermore, the radiation exit area can for example also comprise a plurality of side surfaces or all the side surfaces. As an alternative, the semiconductor layer sequence can also be a vertically emitting laser diode ("VCSEL") or an LED which emits via at least one main surface, such that this can mean that the radiation exit area can comprise a main surface or can be a main surface.

In a further embodiment of the method, the first surface comprises all the side surfaces of the semiconductor layer sequence, such that the layer is applied to all the side surfaces of the semiconductor layer sequence in method step B). As an alternative or in addition, the first surface can also comprise one or both main surfaces. The application of the layer to all the side surfaces of the semiconductor layer sequence can be advantageous, for example, if the semiconductor layer sequence is or comprises an LED or a laser diode. In this case, it can be possible that leakage current paths, ESD failures and/or ageing effects are reduced or avoided by means of the layer for example at chip or mesa edges, in particular in the region of the active region.

In a further preferred embodiment of the method, the method comprises the further method step of:

C) applying at least one layer to a second surface by means of an ion assisted application method, the second surface being arranged on a side of the semiconductor layer sequence that is remote from the first surface.

In particular, this can mean that a layer is applied on a second surface of the semiconductor layer sequence opposite to the first surface. By way of example, the second surface can comprise or be a side surface and/or a radiation exit area. Furthermore, the second surface can be adjacent to the active layer.

In a further embodiment of the method, the layer which is applied in method step B) is different from the layer which is applied in method step C). It can be the case that method steps B) and C) are performed successively. As an alternative, the layers which are respectively applied in method steps B) and C) can be identical, that is to say for example comprise identical materials and/or have identical thicknesses. In this case, method steps B) and C) can also be carried out simultaneously.

In a particularly preferred embodiment of the method, in method step B) a layer which comprises an oxide or is an oxide, in particular a metal oxide and/or a semimetal oxide, is applied to the first surface. In this case, the layer can be suitable for example for preventing moisture and/or oxidizing substances such as oxygen, for instance, from coming into contact with the first surface. It can thereby be possible that oxidation and/or degradation of the first surface can be reduced or prevented by means of the layer. As an alternative or in addition, the layer which is applied to the first surface in method step B) can also have a nitride, for example.

Furthermore, the layer which is applied to the first surface in method step B) and/or the layer which is applied to the second surface in method step C) can have optical properties such as, for instance, a transmission or a reflectivity for the electromagnetic radiation generated during operation in the active layer. In this case, by way of example, there can be applied to the first surface a layer which has a reflectivity and/or transmission which can be different from the reflectivity and/or transmission of a layer which can be applied to the second surface.

In a further embodiment of the method, a plurality of layers is applied to the first surface in method step B) and/or to the second surface in method step C). In this case, it can be particularly preferred if a first layer and a second layer are applied in this case. The first layer and the second layer can form a layer pair in this case. It can furthermore be advantageous if a plurality of layer pairs are applied to the first surface and/or a plurality of layer pairs are applied to the second surface.

Particularly preferably, a layer pair can be applied in which the first layer has a first refractive index and the second layer has a second refractive index, wherein the second refractive index is different from the first refractive index. In particular, a layer pair which has a first and a second layer having different refractive indices and, in each case, a thickness of approximately a quarter of a wavelength, respectively, can at least partly reflect said wavelength. In particular, the reflectivity can increase with the number of layer pairs, such that a plurality of layer pairs, for instance two to ten layer pairs, can be applied for a desired reflectivity.

As an alternative, a layer can have a thickness of approximately half a wavelength or an integral multiple thereof. Such a layer can be in particular at least partly transparent to said wavelength. By way of example, a layer having a thickness which preferably corresponds approximately to one to three times half a wavelength can be applied in this case. Such a layer can be suitable, as a passivation layer, for protecting the semiconductor layer sequence against moisture and/or oxidizing substances such as oxygen, for instance, and for ensuring a desired transmission in this case.

In particular, "a thickness of approximately a quarter of a wavelength" or "a thickness of approximately half a wavelength" can in this case also mean that the thickness of a layer is such that the optical path length for electromagnetic radiation through the layer corresponds approximately to a quarter of the wavelength or approximately to half the wavelength. In this case, the optical path length is the product of the refractive index of the layer and the geometrical thickness.

In a further embodiment of the method, a metal oxide or a semimetal oxide comprises aluminum, silicon, titanium, zirconium, tantalum, niobium, or hafnium. Furthermore, a nitride can also have at least one of the metals and semimetals mentioned, for example silicon nitride. Particularly preferably, the metal oxide or the semimetal oxide comprises at least one of the materials niobium pentoxide, hafnium oxide, aluminum oxide, silicon dioxide, titanium dioxide, tantalum pentoxide, and zirconium dioxide. In particular, it can be advantageous if a layer pair is applied composed of a first layer, which comprises or is tantalum pentoxide and/or zirconium dioxide, and a second layer, which comprises or is silicon dioxide.

In one preferred embodiment of the method, the ion assisted application method comprises features of ion plating or of reactive ion plating or it is such an ion assisted application method. As an alternative or in addition, the ion assisted application method can also have features of ion assisted deposition, of ion beam assisted deposition and/or of ion beam induced deposition or be one of said application methods.

In this case, the ion assisted application method can have at least one of the following features:

generating a gas atmosphere which can have, for example, argon and/or oxygen and/or some other or additional reactive gas. As an alternative or in addition, for example an oxygen beam for forming oxides can also be directed onto the first and/or second surface.

converting a material to be applied, for instance a metal, a semimetal, an oxide or a nitride, from a solid state into a gaseous state. In particular, a plurality of materials to be applied can also be present in a solid mixed state. That converting, which can be evaporation, for instance, can be possible for example by reactive electron beam evaporation, for example by means of a low-voltage plasma arc in the gas atmosphere.

ionizing the material to be applied and accelerating the ionized material to be applied in an electric field toward the semiconductor layer sequence, whereby application of the material on the first and/or second surface can be made possible. As an alternative or in addition, an ionized gas and/or an ionized gas beam which has for example oxygen or some other gas can also be suitable for accelerating the material to be applied toward the first and/or second surface.

The formation of an oxide can be advantageously promoted for example by the use of an ionized oxygen gas or oxygen beam.

In the ion assisted application method, the kinetic energy of the evaporated material to be applied can advantageously be increased in comparison with other vapor deposition methods, which can result in an increased average free path length. It can thereby be possible that layers having an increased density in comparison with other vapor deposition methods can be produced. In this case, the expression "other vapor deposition methods" can designate chemical or physical vapor deposition methods which are not ion assisted application methods. Particularly preferably, a layer which can be produced by means of an ion assisted application method has only a few or no inclusions of gases or impurities, and also a low roughness and a higher refractive index in comparison with some other vapor deposition method. A high density can also advantageously reduce or prevent a permeability to moisture and/or oxygen. A low roughness can be advantageous for minimizing or avoiding scattering losses of the electromagnetic radiation generated during operation in the active region. Furthermore, the adhesion of the layer to the first and/or second surface or to a further layer also of the first and/or second surface can advantageously be increased by means of an ion assisted application method, whereby an increased durability of the layer can be made possible.

In particular, a mask can be used in partial regions of the semiconductor layer sequence in order to avoid application of the material in said partial regions of the semiconductor layer sequence.

Another aspect of the present invention is directed to an optoelectronic component comprising:

a semiconductor layer sequence having at least one active region, wherein the active region is suitable for emitting electromagnetic radiation during operation, and at least one layer on at least one surface, wherein the layer can be produced by means of an ion assisted application method and has a metal oxide and/or semimetal oxide.

In particular, the ion assisted application method can be carried out in accordance with one of the embodiments explained further above.

In one preferred embodiment, the layer or at least one partial region of the layer has a roughness which can be formed for example by topographic surface structures such as depressions or elevations. In this case, the layer can have a roughness on a surface facing the semiconductor layer sequence and/or a surface remote from the semiconductor layer sequence. In particular, a difference between the highest and the lowest topographic surface structure, that is to say the maximum height difference of the topographic surface structures, can define a peak-to-peak roughness. In this case, the peak-to-peak roughness of the layer or the partial region of the layer can be less than approximately 4 nm, preferably less than or equal to approximately 2 nm, and particularly preferably less than or equal to approximately 1 nm.

In a further preferred embodiment, the layer has a refractive index of greater than or equal to 2.25.

In particular, the layer in this case can have tantalum pentoxide or zirconium dioxide. In this case, the refractive index can preferably denote a refractive index for electromagnetic radiation in a wavelength range from approximately 390 nm to approximately 430 nm.

In a further embodiment, the surface comprises at least one side surface of the semiconductor layer sequence. In this case, the side surface can be for example adjacent to the active layer of the semiconductor layer sequence. In particular, the surface can be a light exit area for the electromagnetic radiation generated in the active region.

DETAILED DESCRIPTION OF THE DRAWINGS

Figure 1A:
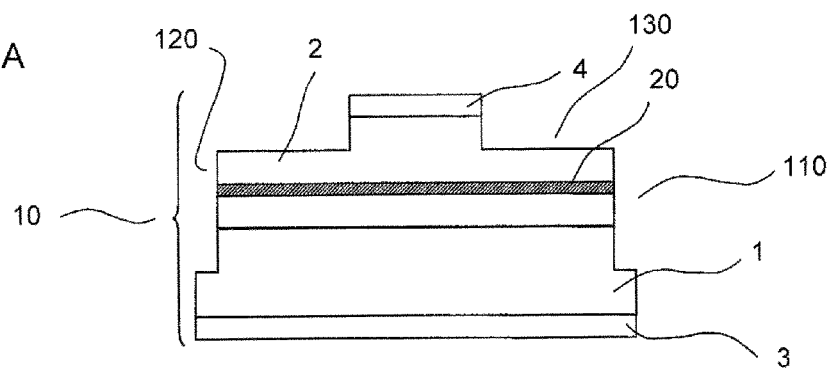
FIGS. 1A to 1C show schematic illustrations of cross sections of optoelectronic components during different stages of an exemplary embodiment of the method.

In the drawings, identical or identically acting constituent parts can in each case be provided with the same reference symbols. The illustrated elements and their size relationships among one another should not be regarded as true to scale. Rather, individual elements such as, for example, layers, devices, components and regions can be illustrated with an exaggerated thickness or size dimensioning for the sake of better representability and/or for the sake of a better understanding.

Figure 1B:
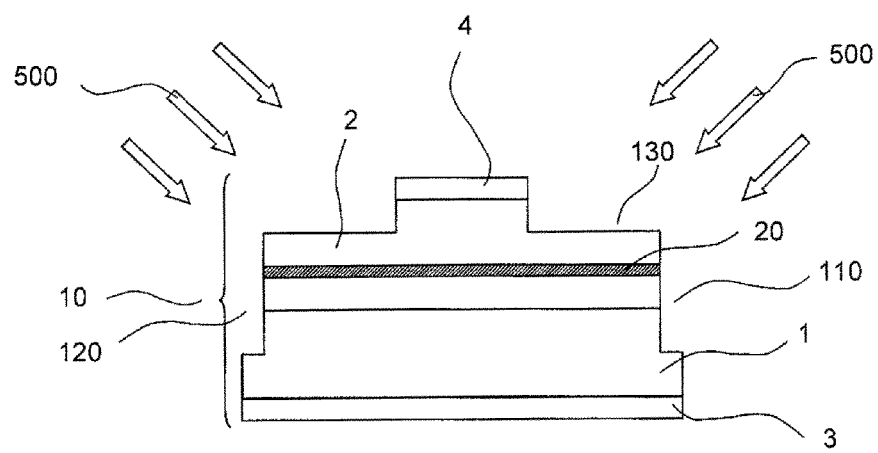
Figure 1C:
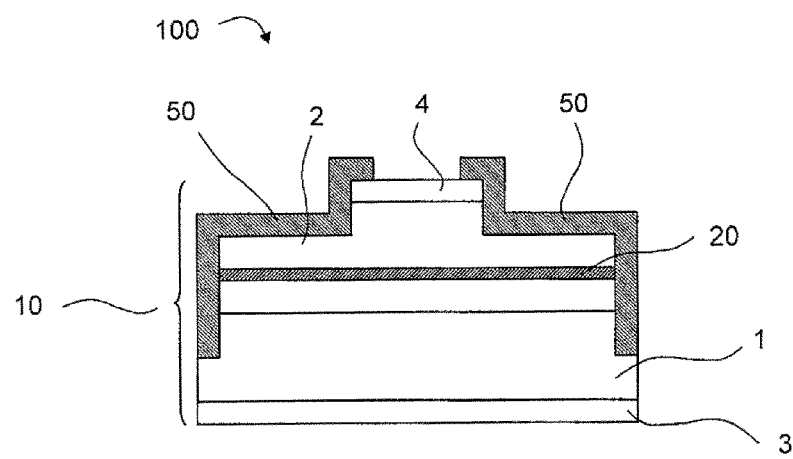

Different stages of a method for producing an optoelectronic component 100 are shown in the exemplary embodiment in accordance with FIGS. 1A to 1C.

In this case, FIG. 1A shows a semiconductor layer sequence 10, which is provided in a first method step. In this case, the semiconductor layer sequence 10 has an epitaxial layer sequence 2 grown on a substrate 1 and having an active region 20. As an alternative, the substrate 1 can also be a carrier substrate for a thin-film semiconductor layer sequence 10. The semiconductor layer sequence 10 can be electrically contact-connected and put into operation by means of two electrical contacts 3, 4. In this case, the electrical contact 3 is preferably formed as an n-conducting contact or as an n-conducting electrode, while the electrical contact 4 is formed as a p-conducting contact or a p-conducting electrode. As an alternative, the electrical contact 4 can also be formed in n-conducting fashion and the electrical contact 3 can be formed in p-conducting fashion. Correspondingly, the epitaxial layer sequence 2 also has n- and p-conducting layers and regions. The active region 20 is suitable for emitting electromagnetic radiation during operation. The materials of the semiconductor layer sequence 2 and the structure of the active region 20 can be embodied in accordance with one or a plurality of embodiments in the general part of the description presented above. In particular, the semiconductor layer sequence 10 has a first surface comprising the side surfaces 110, 120 and at least part of the main surface 130.

In this case, the semiconductor layer sequence 10 can be for example a semiconductor layer sequence for an LED, wherein the LED has for example a radiation exit area comprising the side surfaces 110, 120 and/or the main surface 130. As an alternative, the semiconductor layer sequence 10 can be a semiconductor layer sequence for a laser diode.

FIG. 1B shows, in accordance with a further method step of the exemplary embodiment, the application 500 of a layer 50 (shown in FIG. 1C) to the first surface, that is to say the side surfaces 110, 120 and the main surface 130. In order that the layer 50 is applied only on the first surface, a mask, for example, can be used (not shown). In this case, the layer 50 is applied by means of an ion assisted application method, for example by means of ion plating or reactive ion plating. For this purpose, the semiconductor layer sequence 10 is preferably arranged in an argon atmosphere in which, for example, tantalum or tantalum pentoxide is evaporated and ionized by means of a low-voltage plasma arc and is applied by means of an electric field and/or an additional oxygen beam, which can likewise be ionized, on the side surfaces 110, 120 and the main surface 130 in the form of a layer having tantalum pentoxide. As an alternative, for example a silicon dioxide layer or a zirconium oxide layer can also be applied. In this case, the layer 50 serves in particular for passivation, which means that the layer 50 has a low transmissivity to moisture and oxidizing substances such as oxygen, for instance.

As shown in FIG. 1C, the optoelectronic component 100 has the semiconductor layer sequence 10 with the layer 50 formed as passivation layer. The layer 50 particularly preferably has a thickness of approximately 1.5 times the wavelength of the electromagnetic radiation generated in the active region 20 and is distinguished by a high layer homogeneity without inclusions or impurities. Since the layer 50 is adjacent to the epitaxial layer sequence 2 and the active region 20, in particular the active region 20 and the epitaxial layer sequence 2 can be protected against moisture and oxidizing substances such as oxygen, for instance. Furthermore, for example disadvantageous effects such as, for instance, leakage currents or ESD failures and also ageing effects can be reduced or prevented.

Figure 2A:
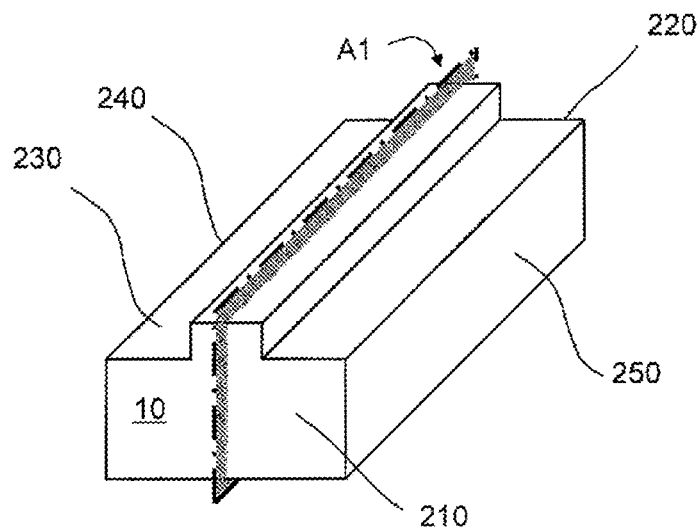
FIGS. 2A to 2C show schematic illustrations of cross sections of optoelectronic components during different stages of a further exemplary embodiment of the method.

FIG. 2A shows a schematic three-directional illustration of an exemplary embodiment showing a semiconductor layer sequence 10 for a so-called "ridge waveguide laser", said semiconductor layer sequence being provided as an edge emitting laser diode in a first method step. The semiconductor layer sequence 10 has a first surface 210 and a second surface 220, which are formed as radiation exit areas. In this case, in a further method step, a passivation layer in accordance with the previous exemplary embodiment can be applied to the semiconductor layer sequence 10 after the provision thereof, in particular to the side surfaces 240, 250 and/or the main surface 230.

Figure 2B:
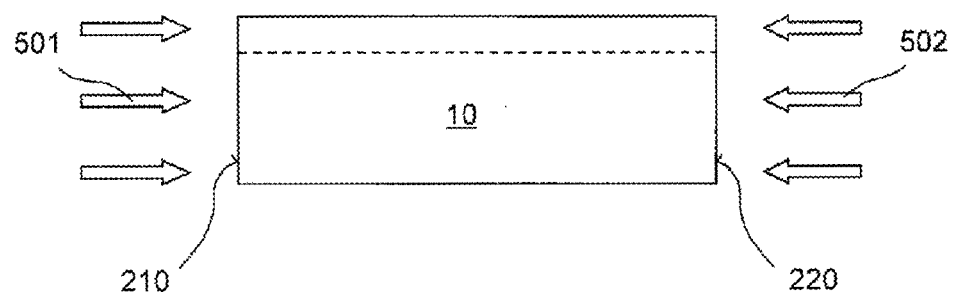
Figure 2C:
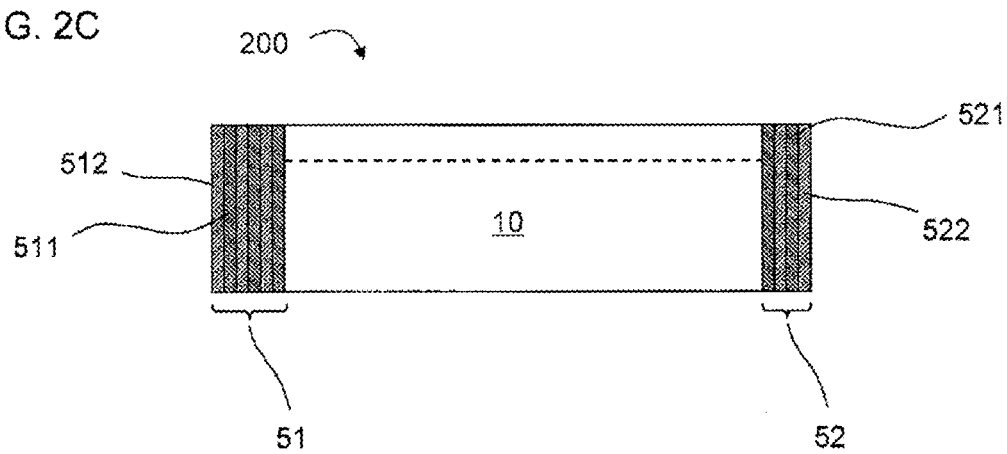

FIG. 2B shows a schematic sectional illustration of the semiconductor layer sequence 10 along the sectional plane A1 illustrated in FIG. 2A. In further method steps 501 and 502, in each case a plurality 51, 52 of layer pairs are applied to the first surface 210 and the second surface 220 by means of ion assisted application methods (as shown in FIG. 2C). In this case, the plurality 51 of layer pairs comprises layer pairs each having a first layer 511, which has or is composed of tantalum pentoxide or zinc oxide, and a second layer 512, which comprises or is silicon dioxide. The plurality 52 of layer pairs on the second surface 220 comprises layer pairs each having a first layer 521 and a second layer 522, which are identical to some of the layer pairs of the plurality 51 of layer pairs on the first surface. In particular, method steps 501 and 502 can then be carried out partly simultaneously.

FIG. 2C shows the optoelectronic component 200 produced in this way in the same cross section as FIG. 2B: The first layers 511, 521 and the second layers 512, 522 have a layer thickness of approximately a quarter of the wavelength of the electromagnetic radiation generated in the active region of the semiconductor layer sequence 10. As a result, both pluralities 51, 52 of layer pairs can in each case have a reflectivity for the electromagnetic radiation generated in the active region. The respective reflectivity can be chosen according to the requirements made of the optoelectronic component 200. By way of example, the plurality 51 can have approximately five layer pairs for a reflectivity of at least 90% or approximately seven to ten layer pairs for a reflectivity of at least 99%. The plurality 51 of layer pairs can also have a transmission, such that a small proportion of the electromagnetic radiation generated in the active region of the semiconductor layer sequence 10 can be emitted via the first surface 210 and the plurality 51 of layer sequences. Said small proportion can be used for example as a monitor signal for the power or frequency stabilization of the electromagnetic radiation generated.

The plurality 52 of layer pairs on the second surface 220 preferably has fewer layer pairs than the plurality 51 on the first surface 210, for example approximately two layer pairs or one layer pair. As a result, a portion of the electromagnetic radiation generated in the active region of the semiconductor layer sequence 10 can be emitted via the second surface 220 and the plurality 52 of layer pairs, while a further portion can be reflected back into the active region in order to support the laser activity of the semiconductor layer sequence 10.

As an alternative, there can be applied to the second surface 220, instead of the plurality 52 of layer pairs, also only a single layer as passivation layer by means of an ion assisted application method.

Figure 3A:
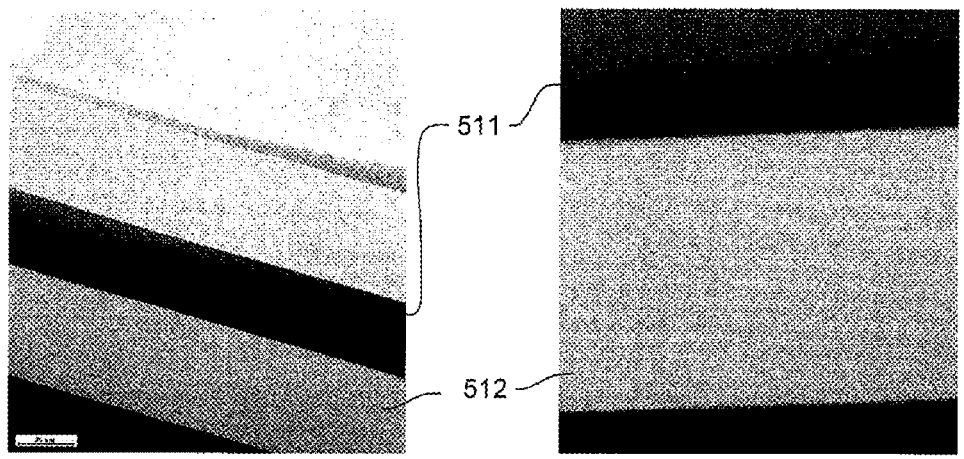
FIGS. 3A and 3B show transmission micrographs of layers producible according to a method in accordance with one exemplary embodiment and in accordance with the prior art.

In this case, the layer pairs applied in the exemplary embodiments portrayed have properties as explained in conjunction with FIG. 3A.

Figure 3B:
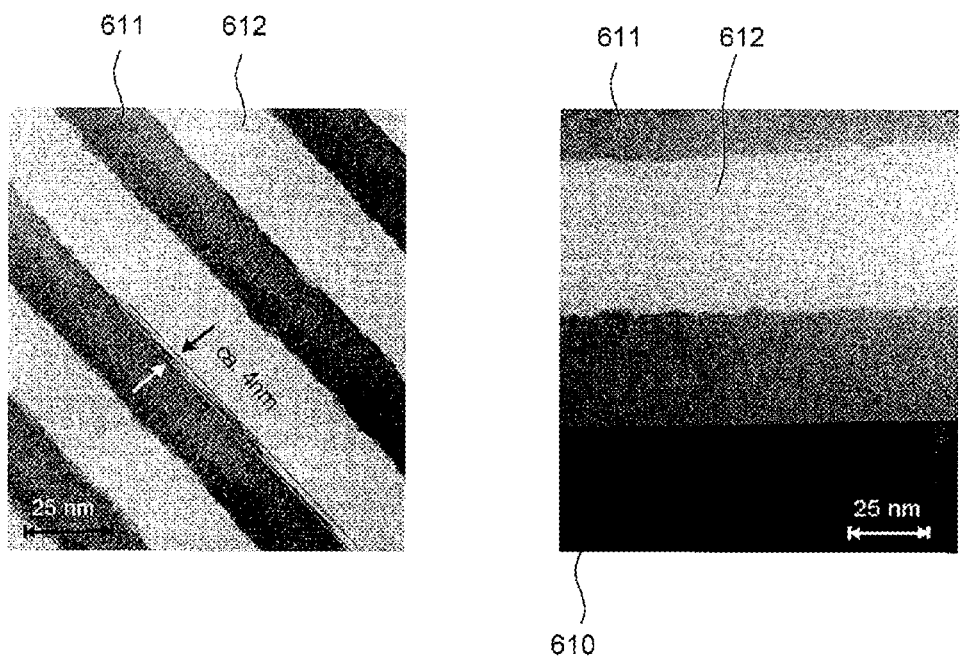

FIGS. 3A and 3B each show two transmission micrographs of partial excerpts from layer pairs respectively having first layers 511, 611 and second layers 512, 612. In this case, the layer pairs in accordance with FIG. 3A were produced by means of ion plating, while the layer pairs of FIG. 3B were produced by means of some other, non-ion assisted vapor deposition method. The scale in the micrographs of FIG. 3A and the micrographs of FIG. 3B is approximately identical in this case. The first layers 511, 611 are in each case tantalum pentoxide layers and the second layers 512, 612 are in each case silicon dioxide layers. In this case, the layers were respectively applied to a GaN substrate 610, which can likewise be seen in one of the micrographs of FIG. 3B.

The first and second layers 511, 512 produced by ion plating in accordance with the micrographs of FIG. 3A have a low peak-to-peak roughness of less than 1 nm at the layer boundaries. Furthermore, the first and second layers 511, 512 have no discernible inclusions and in each case a very homogeneous density, discernible by virtue of the homogeneous colorations in the micrographs. Ellipsometer measurements at the first layers 511 revealed a refractive index of 2.25 for a wavelength of approximately 390 nm to approximately 430 nm.

By contrast, the layer pairs produced by a non-ion assisted vapor deposition method in accordance with FIG. 3B have a peak-to-peak roughness of approximately 4 nm at the layer boundaries of the first and second layers 611, 612. Furthermore, density differences in the respective layers as a result of inclusions and impurities are discernible from the irregular coloration of the layers in the micrographs shown. The refractive index of the first layers 611 was only approximately 2.08 for a wavelength from approximately 390 nm to approximately 430 nm, which permits the conclusion of a lower density than in the layers 511 of FIG. 3A.

The ion plating for producing layer sequences having homogeneous first and second layers 511, 512 shown in accordance with FIG. 3A thus enables the production of layer pairs which have, as a result of a homogeneous and higher density, better barrier properties with regard to moisture and oxygen and better optical properties than layer sequences which can be produced by a non-ion assisted vapor deposition method.

The invention is not restricted to the exemplary embodiments by the description on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. A method for producing an optoelectronic component, comprising:
   providing a semiconductor layer sequence having at least one active region, wherein the at least one active region emits electromagnetic radiation during operation; and
   applying, with an ion assisted application method, at least one layer directly on a first surface of the semiconductor layer sequence such that the at least one layer has a peak-to-peak roughness of less than approximately 4 nm,
   applying, with an ion assisted application method, at least one layer directly on a second surface of the semiconductor layer sequence such that the at least one layer has a peak-to-peak roughness of less than approximately 4 nm, the second surface arranged on a side of the semiconductor layer sequence that is remote from the first surface,
   wherein material applied by the ion assisted application method is one of:
     ionized and accelerated in an electric field towards the semiconductor layer sequence, and
     accelerated by at least one of an ionized gas and an ionized gas beam,
   wherein the second surface comprises a radiation exit area,
   wherein the applying the at least one layer on the first surface consists of applying a plurality of layer pairs, each of said layer pairs consisting of a first layer and a second layer,
   wherein the applying the at least one layer on the second surface consists of applying a plurality of layer pairs, each of said layer pairs consisting of a first layer and a second layer,
   wherein each first layer consists of tantalum pentoxide,
   wherein each second layer comprises silicon dioxide,
   wherein each of the first and second layers has a thickness of approximately a quarter of the wavelength of the electromagnetic radiation emitted by the active region of the semiconductor layer sequence, and
   wherein a number of layer pairs on the second surface is less than a number of layer pairs on the first surface.

2. The method of claim 1, wherein the first surface is a side surface of the semiconductor layer sequence.

3. The method of claim 2, wherein the at least one layer applied on the first surface is applied to each of the side surfaces.

4. The method of claim 1, wherein the first surface is adjacent to the at least one active region.

5. The method of claim 1, wherein the at least one layer applied on the first surface is different from the another at least one layer applied to the second surface.

6. The method of claim 1, wherein the applying the at least one layer to the first surface and the applying the another at least one layer to the second surface are carried out simultaneously.

7. The method of claim 1, wherein the ion assisted application method is one of ion plating and reactive ion plating.

8. The method of claim 1, wherein the at least one layer is applied on the first surface of the semiconductor layer sequence by the ion assisted application method such that the at least one layer has a refractive index of greater than or equal to 2.25.

9. The method of claim 1, wherein the number of layer pairs on the first surface is five or seven to ten, and wherein the number of layer pairs on the second surface is one or two.

10. The method of claim 9, wherein the number of layer pairs on the second surface is one.

* * * * *